(12) United States Patent
Shieh et al.

(10) Patent No.: US 6,174,644 B1
(45) Date of Patent: Jan. 16, 2001

(54) ANTI-REFLECTIVE SILICON NITRIDE FILM USING IN-SITU DEPOSITION

(75) Inventors: Meng-Shiun Shieh, Changhua; Po-Chieh Cheng, Hsin-Chu, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/345,362

(22) Filed: Jul. 1, 1999

Related U.S. Application Data

(62) Division of application No. 08/742,228, filed on Oct. 31, 1996, now Pat. No. 5,948,598.

(51) Int. Cl.⁷ .................. G03F 7/00; B32B 9/04
(52) U.S. Cl. .................. 430/272.1; 430/290; 257/437; 428/446; 428/448
(58) Field of Search .............. 430/272.1, 290; 257/437; 428/446, 448

(56) References Cited

U.S. PATENT DOCUMENTS

| | | | |
|---|---|---|---|
| 5,126,289 | 6/1992 | Ziger | 437/231 |
| 5,216,542 | 6/1993 | Szczyrbowski et al. | 359/588 |
| 5,378,659 | 1/1995 | Roman et al. | 437/229 |
| 5,441,914 | 8/1995 | Taft et al. | 437/189 |
| 5,449,639 | 9/1995 | Wei et al. | 437/187 |
| 5,639,687 * | 6/1997 | Roman et al. | 437/186 |

* cited by examiner

Primary Examiner—Janet Baxter
Assistant Examiner—Rosemary Ashton
(74) Attorney, Agent, or Firm—George O. Saile; Stephen B. Ackerman; Larry J. Prescott

(57) ABSTRACT

An anti-reflective coating and method of forming the anti-reflective coating are described wherein the anti-reflective coating is part of a silicon nitride layer formed on a semiconductor integrated circuit substrate. The anti-reflective coating is formed under the photoresist layer for greater effectiveness but does not disrupt the process flow since the anti-reflective coating is part of the silicon nitride layer. A first silicon nitride layer is formed having an index of refraction of about 2.1. A second silicon nitride layer having an index of refraction of about 1.9 and a second thickness is formed on the first silicon nitride layer. A layer of photoresist is then formed on the second silicon nitride layer. The second thickness is chosen to be equal to the wavelength of the light used to expose the layer of photoresist divided by the quantity of 4 multiplied by 1.9. The second silicon nitride layer acts as an effective anti-reflective layer.

5 Claims, 3 Drawing Sheets

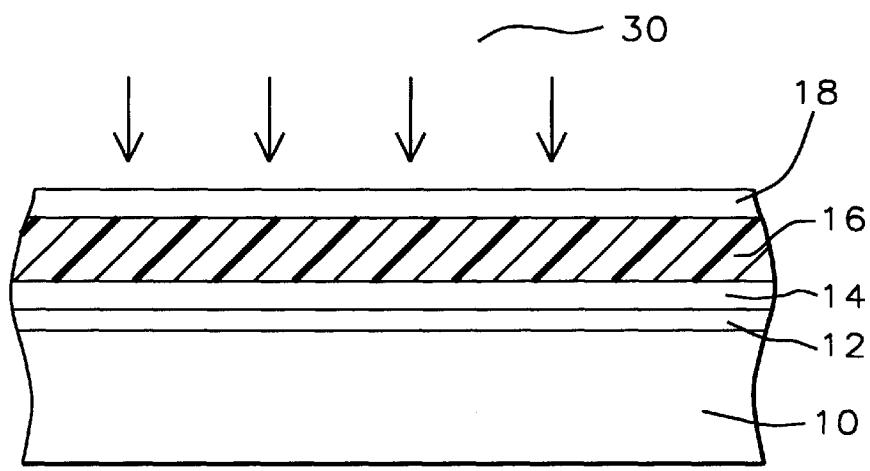
FIG. 1A – Prior Art
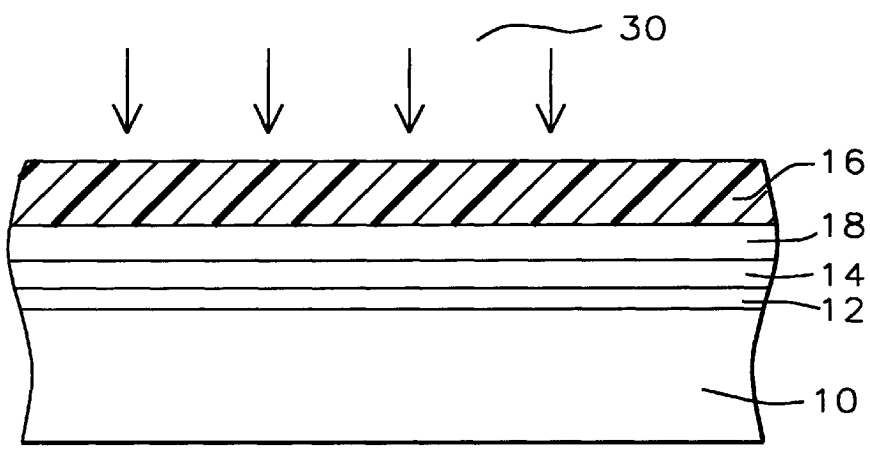
FIG. 1B – Prior Art
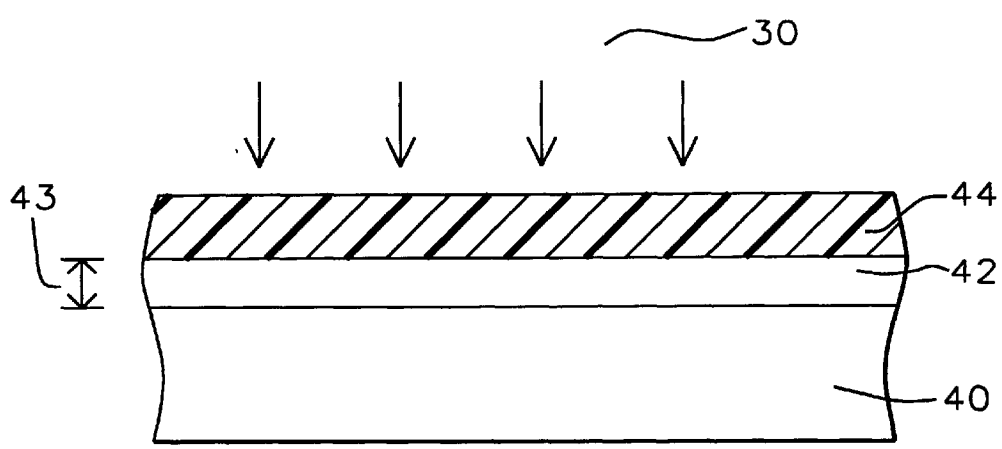
FIG. 2

ANTI-REFLECTIVE SILICON NITRIDE FILM USING IN-SITU DEPOSITION

This is a division of patent application Ser. No. 08/742,228, filing date Oct. 31, 1996 U.S. Pat. No. 5,948,598, Anti-Reflective Silicon Nitride Film Using In-Situ Deposition, assigned to the same assignee as the present invention.

BACKGROUND OF THE INVENTION (1) Field of the Invention

This invention relates to an anti-reflective coating formed on the bottom of a photoresist layer and more particularly to the deposition of a silicon nitride film having a low index of refraction, 1.9, over a silicon nitride film having a higher index of refraction, 2.1, to form the anti-reflective coating.

(2) Description of the Related Art

U.S. Pat. No. 5,378,659 to Roman et al. describes the use of a silicon-rich silicon nitride layer, having an absorptive index greater than 0.25, as an anti-reflective coating for use in photolithographic processing.

U.S. Pat. No. 5,441,914 to Taft et al. describes using a thin silicon layer between a patterned tungsten silicide layer and an overlying patterned silicon nitride anti-reflective layer to prevent delamination of the anti-reflective layer.

U.S. Pat. No. 5,216,542 to Szczyrbowski et al. describes a five layer system to provide an effective anti-reflective effect.

U.S. Pat. No. 5,126,289 to Ziger describes the use of an organic material which is highly absorptive of deep ultra violet actinic light to provide anti-reflection effects as well as surface planarization.

U.S. Pat. No. 5,449,639 to Wei et al. describes a method of metal etching using a disposable metal anti-reflective coating.

The anti-reflective coating described in this Patent Application uses a second silicon nitride layer, having a low silicon to nitrogen ratio and a relatively low index of refraction, formed over a first silicon nitride layer, having a high silicon to nitrogen ratio and a relatively high index of refraction, to provide an effective anti-reflective coating.

SUMMARY OF THE INVENTION

Patterns are typically formed in a layer of material, such as silicon nitride, on a semiconductor substrate by forming a photoresist layer over the layer of material, exposing the pattern in the photoresist layer, developing the exposed photoresist layer, and using the developed photoresist layer as a mask to form the pattern in the layer of material. The photoresist layer is exposed using light which has passed through a mask and is focussed on the photoresist layer. During the exposure of the photoresist layer light can enter the photoresist layer and set up multiple reflections within the photoresist layer. The multiple reflections within the photoresist layer will cause constructive and destructive interference at various points within the photoresist layer which will degrade the pattern formed photoresist layer and in the layer of material where the desired image is to be formed.

Anti-reflective coatings are often used to solve the problems caused by the effect of standing waves in a layer of photoresist. Two types of conventional anti-reflective coatings are shown in FIGS. 1A and 1B. FIG. 1A shows a semiconductor substrate 10 with a layer of pad oxide 12 formed thereon. A layer of silicon nitride 14 is formed on the layer of pad oxide. In order to form a pattern in the layer of silicon nitride 14 a layer of photoresist 16 is formed on the layer of silicon nitride 14. The photoresist is exposed using a light 30 which has passed through a mask and focussed on the layer of photoresist 16. An layer of anti-reflective material 18 is formed over the layer of photoresist to prevent multiple reflections within the layer of photoresist 16 from setting up standing waves and distorting the pattern formed in the photoresist.

A second type of conventional anti-reflective coating is shown in FIG. 1B. In this case the anti-reflective coating 18 is formed under the photoresist layer 16 and over the layer of silicon nitride 14 to be patterned. The anti-reflective coating shown in FIG. 1B with the anti-reflective coating under the photoresist layer is more effective in preventing problems due to standing waves but this type of anti-reflective coating increases the complexity of the process flow.

It is an objective of this Invention to provide a method of forming an anti-reflective coating over a silicon nitride layer and under a photoresist layer which does not increase the complexity of the process flow and provides good anti-reflective characteristics.

It is another objective of this Invention to provide a method of forming a pattern in a layer of silicon nitride using an anti-reflective coating under the photoresist layer which does not increase the complexity of the process flow and provides good anti-reflective characteristics.

It is another objective of this Invention to provide an anti-reflective coating under a photoresist layer for use in forming a pattern in a silicon nitride layer.

These objectives are achieved by causing variations in the silicon nitride layer as it is being formed in order to use part of the silicon nitride layer as an in-situ anti-reflective coating. FIG. 2 shows a diagram of a light beam 30 illuminating a layer of first material 40 having an index of refraction $n_1$, a layer of second material 42 having an index of refraction $n_2$, and a layer of photoresist 44 having an index of refraction $n_3$. The light has a wavelength $\lambda_0$. The layer of second material 42 will act as an effective anti-reflective coating preventing standing waves in the photoresist layer 44 if the index of refraction of the second material, $n_2$, is equal to the square root of $n_1$ multiplied by $n_3$, and if the thickness, t, of the layer of second material 43 is equal to the wavelength, $\lambda_0$, divided by the quantity of the index of refraction of the second material, $n_2$, multiplied by four, $\lambda_0/(4n_2)$ The index of refraction of the photoresist, $n_3$, is about 1.68 and the index of refraction of silicon nitride can be varied from 1.9 to 2.1 depending on the ration of silicon to nitrogen in the silicon nitride layer. In this invention the layer of first material 40 is silicon nitride with a high silicon to nitrogen ratio and having an index of refraction of about 2.1. The layer of second material is silicon nitride with a low silicon to nitrogen ratio having an index of refraction of about 1.9. The square root of 1.68 multiplied by 2.1 is 1.878 which is very nearly equal to 1.9.

For an i line source having a wavelength of 3650 Angstroms the thickness of the layer of second material, silicon nitride with an index of refraction of 1.9, is about 480 Angstroms which is 3650 Angstroms divided by the quantity of 1.9 multiplied by 4. For an application using a silicon nitride layer having a thickness of 1500 Angstroms the thickness of the layer of first material, silicon nitride with an index of refraction of 2.1, is about 1020 Angstroms.

The objectives of the invention are achieved by forming a first silicon nitride layer with a high silicon to nitrogen ratio and an index of refraction of 2.1. A second silicon nitride layer with a low silicon to nitrogen ratio is formed on the first silicon nitride layer wherein the second silicon nitride layer has an index of refraction of 1.9 and a thickness of 480 Angstroms. When a layer of photoresist is formed over the second silicon nitride layer the second silicon nitride layer forms an effective anti-reflection layer.

BRIEF DESCRIPTION OF THE DRAWINGS

FIG. 1A shows a cross section view of a semiconductor integrated circuit wafer using an anti-reflective coating over the photoresist.

FIG. 1B shows a cross section view of a semiconductor integrated circuit wafer using an anti-reflective coating under the photoresist.

FIG. 2 shows a diagram of a light beam illuminating a layer of photoresist formed over a second layer of material which is formed over a first layer of material.

DESCRIPTION OF THE PREFERRED EMBODIMENTS

Figure 3:
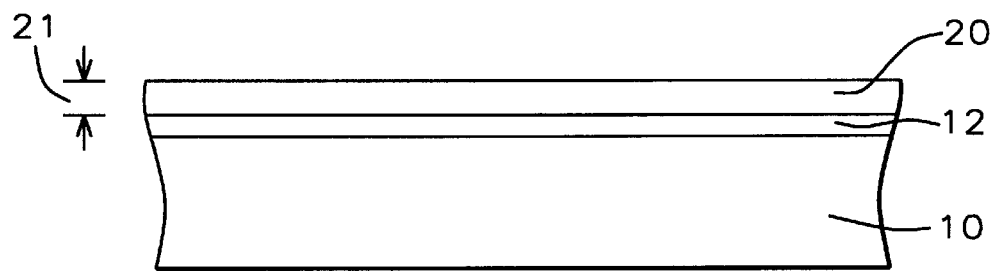
FIG. 3 shows a cross section view of a layer of pad oxide and a first silicon nitride layer formed on a semiconductor integrated circuit substrate wafer.
Figure 4:
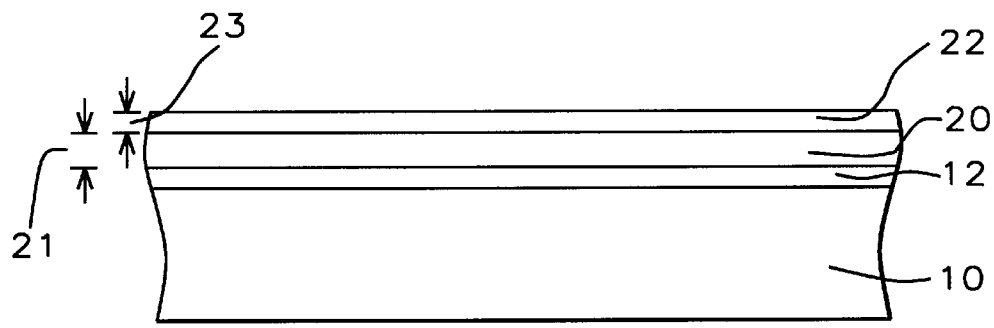
FIG. 4 shows a cross section view of the integrated circuit substrate of FIG. 3 with a second silicon nitride layer formed on the first silicon nitride layer.
Figure 5:
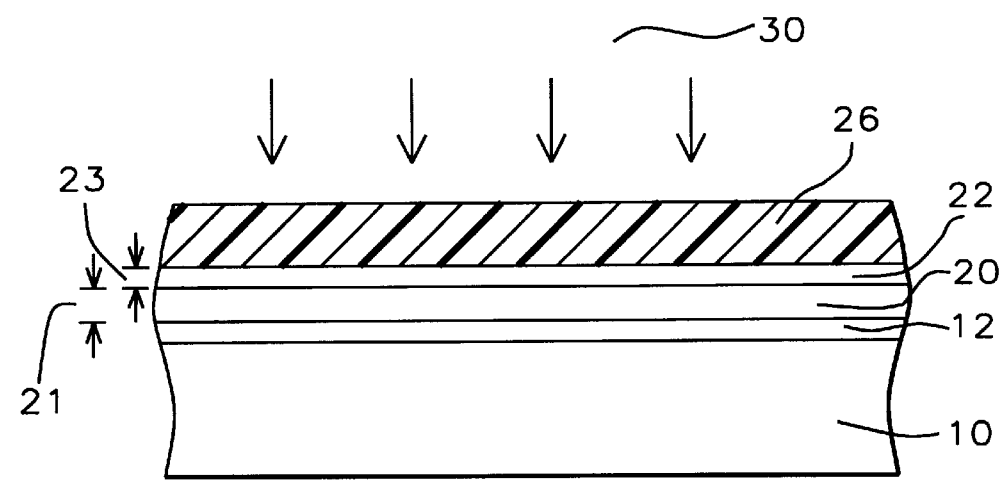
FIG. 5 shows a cross section view of the integrated circuit substrate of FIG. 4 with a photoresist layer formed on the second silicon nitride layer and a light beam illuminating the photoresist layer.

Refer now to FIGS. 3, 4, and 5, there is shown the preferred embodiment of the anti-reflective coating of this invention. As shown in FIG. 3, a layer of pad oxide 12 is formed on a semiconductor integrated circuit substrate 10. Next, a first silicon nitride layer 20 having a first thickness 21 is formed on the layer of pad oxide using a method such as low pressure chemical vapor deposition, plasma enhanced chemical vapor deposition, or the like. The deposition of the first silicon nitride layer is adjusted to give a high silicon to nitrogen ratio, greater than 0.75, resulting in an index of refraction of between about 2.08 and 2.12 and a first thickness 21 of between about 1410 and 1590 Angstroms.

Next, as shown in FIG. 4, a second silicon nitride layer 22 having a second thickness 23 is formed on the first silicon nitride layer 20 using a method such as low pressure chemical vapor deposition, plasma enhanced chemical vapor deposition, or the like. The deposition of the second silicon nitride layer is adjusted to give a low silicon to nitrogen ratio, less than 0.75, resulting in an index of refraction of between about 1.88 and 1.92 and a second thickness 23 of between about 450 and 510 Angstroms.

Next, as shown in FIG. 5, a layer of photoresist 26, having an index of refraction of about 1.68, is formed on the second silicon nitride layer 22. The second silicon nitride layer 22 will form an effective anti-reflective coating when the photoresist is illuminated with light having a wavelength of about 3650 Angstroms. For light having a different wavelength a different second thickness 23 for the second layer of silicon nitride 22 must be used. The second thickness 23 of the second silicon nitride layer 22 is chosen to be equal to the wavelength of the light used divided by the quantity of 4 multiplied by the index of refraction of the second silicon nitride layer, in this example 1.9.

Figure 6:
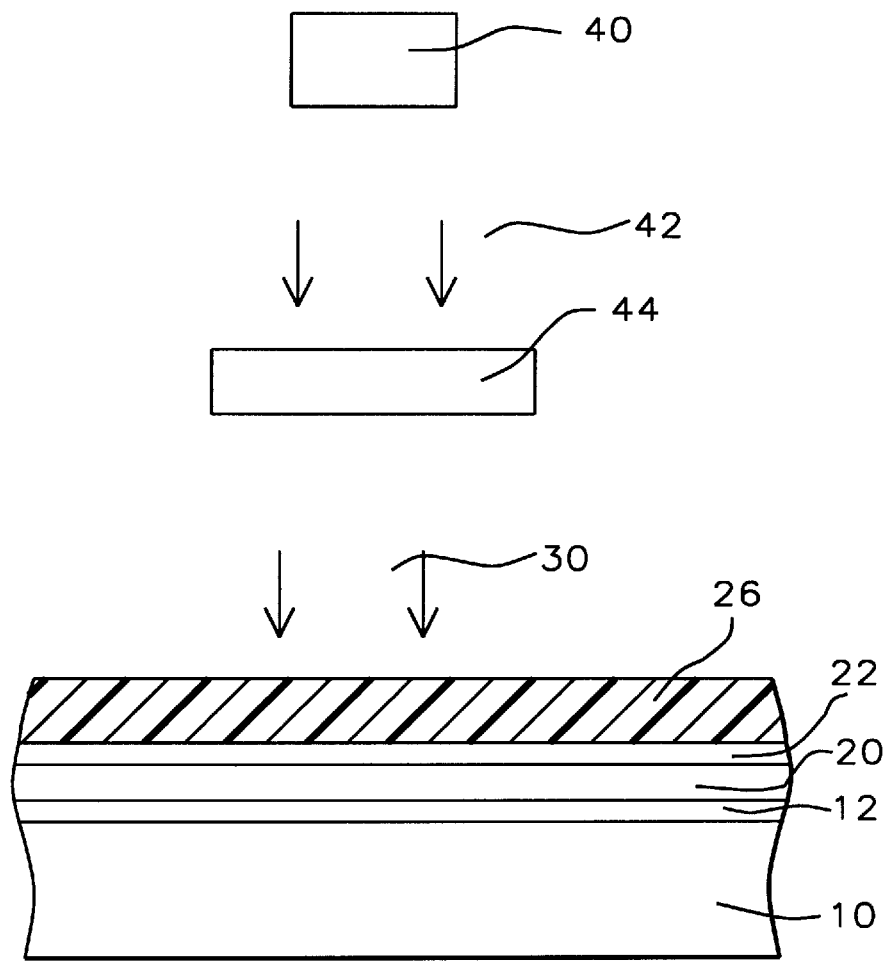
FIG. 6 shows a block diagram of an exposure apparatus used to expose the photoresist layer.

As shown in FIG. 5, the photoresist layer 26 is then illuminated by light 30 which has passed through a mask and is focussed on the photoresist layer 26. In this example the light is from an i line source having a wavelength of 3650 Angstroms. FIG. 6 shows a block diagram of an exposure apparatus, such as a five times reduction stepper, used to expose the photoresist layer 26. A light beam 42 is produced by a light source 40, in this example an i line source having a wavelength of 3650 Angstroms, and directed to a mask and mask holder apparatus 44. A light beam 30 emerges from the mask and mask holder apparatus 44 and is focussed on the photoresist layer 26. The semiconductor integrated circuit substrate 10, pad oxide layer 12, first silicon nitride layer 20, second silicon nitride layer 22, and photoresist layer 26 are as previously described.

While the invention has been particularly shown and described with reference to the preferred embodiments thereof, it will be understood by those skilled in the art that various changes in form and details may be made without departing from the spirit and scope of the invention.

What is claimed is:

1. An anti-reflective coating made by the process of providing:

a source of light having a first wavelength;

an integrated circuit substrate;

a pad oxide layer formed on said integrated circuit substrate;

a first silicon nitride layer having a first thickness and a first index of refraction formed on said pad oxide layer wherein said first silicon nitride layer is formed so that said first index of refraction is between about 2.08 and 2.12;

a second silicon nitride layer having a second thickness and a second index of refraction formed on said first silicon nitride layer wherein said second silicon nitride layer is formed so that said second index of refraction is between about 1.88 and 1.92 and said second thickness is about equal to one fourth of said first wavelength divided by said second index of refraction;

a photoresist layer formed on said second silicon nitride layer wherein said photoresist layer has an index of refraction of between about 1.66 and 1.70 and said photoresist layer will be exposed using said source of light having said first wavelength.

2. The anti-reflective coating of claim 1 wherein said first silicon nitride layer has a ratio of silicon to nitrogen of greater than 0.75.

3. The anti-reflective coating of claim 1 wherein said second silicon nitride layer has a ratio of silicon to nitrogen of less than 0.75.

4. The anti-reflective coating of claim 1 wherein said first wavelength is about 3650 Angstroms and said second thickness is between about 450 and 510 Angstroms.

5. The anti-reflective coating of claim 1 wherein the sum of said first thickness and said second thickness is between about 1410 and 1590 Angstroms.

* * * * *